United States Patent [19]

Shepherd

[11] Patent Number: 4,980,653
[45] Date of Patent: Dec. 25, 1990

[54] PHASE LOCKED LOOP
[75] Inventor: Wayne P. Shepherd, Sunrise, Fla.
[73] Assignee: Motorola, Inc., Schaumburg, Ill.
[21] Appl. No.: 402,715
[22] Filed: Sep. 5, 1989
[51] Int. Cl.$^5$ .............................................. H03L 7/18
[52] U.S. Cl. ........................................ 331/16; 331/17; 331/25
[58] Field of Search ...................... 331/14, 16, 17, 25

[56] References Cited

U.S. PATENT DOCUMENTS

| | | | |
|---|---|---|---|
| 4,330,758 | 5/1982 | Swisher et al. | 331/14 X |
| 4,568,888 | 2/1986 | Kimura et al. | 331/10 |
| 4,714,899 | 12/1987 | Kurtzman et al. | 331/1 A |
| 4,745,372 | 5/1988 | Miwa | 331/14 X |

OTHER PUBLICATIONS

Motorola, "Operation of the MC145159 PLL Frequency Synthesizer with Analog Phase Detector", (1987).

Primary Examiner—David Mis
Attorney, Agent, or Firm—Michael J. Buchenhorner

[57] ABSTRACT

A phase locked loop (100) with a sample and hold phase detector (106) with adjustable gain. A switching circuit adjusts the slew rate of the phase detector by either introducing additional ramp capacitance (122) in the phase detector or by increasing the current for charging the ramp capacitor (116).

6 Claims, 1 Drawing Sheet

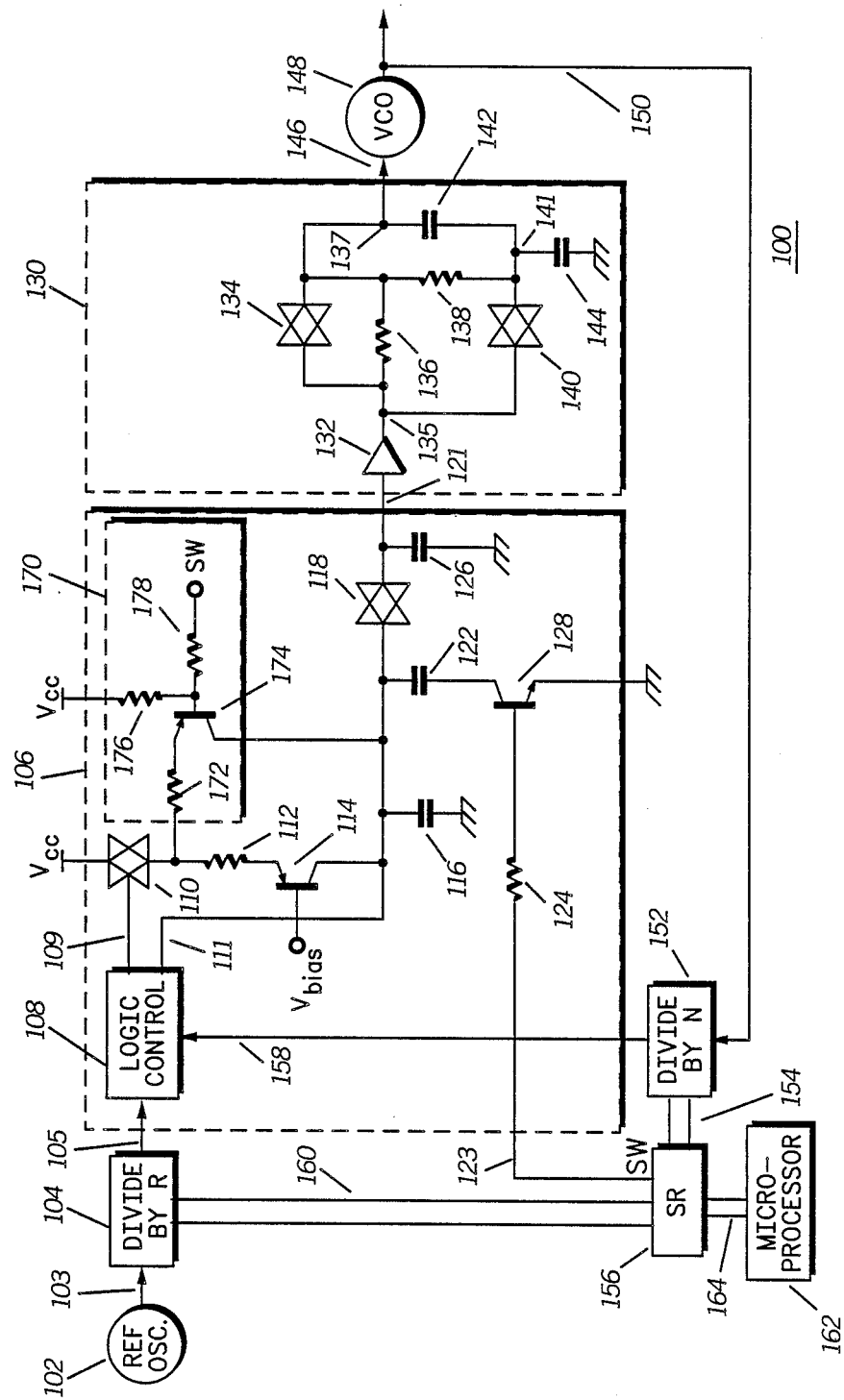

PHASE LOCKED LOOP

TECHNICAL FIELD

This invention relates generally to phase locked loops (PLLs), and more specifically to those PLLs using sample and hold phase detectors.

BACKGROUND

Conventional PLLs typically include a reference oscillator and a reference divider, a phase detector, a feedback divider, a low-pass loop filter, and a voltage-controlled oscillator (VCO). The fundamentals of PLL operation are well understood by contemporary designers.

The low-pass filters used in such conventional PLLs typically have a narrow passband, causing the time constant of the PLL to be large. A large time constant is undesirable for many radio applications of PLLs where a fast lock rate (i.e., the time it takes the PLL to lock onto a frequency) is required. One possible solution to this problem is to use a loop filter with a broader bandwidth. However, that solution has the detriment that it makes the input to the VCO noisier. Thus, lock time would be improved at the expense of performance.

Moreover, in some radio PLL circuits, more than one reference frequency is used, to generate the first local oscillator and the transmit frequencies, and a high-frequency first intermediate frequency is also used. This causes a large difference in operating frequencies. Therefore, the loop bandwidth must be a compromise for both bands of operation. That compromise degrades the lock time performance.

Other radio applications for PLLs, such as frequency scanning systems, require a faster lock time for receive-to-receive transitions than for receive-to-transmit transitions. In such cases, the loop gain must be compromised with respect to the lock times required causing degradation in each lock time.

SUMMARY OF THE INVENTION

Accordingly, it is an object of the present invention to provide a phase locked loop that avoids the detriments of the prior art.

Briefly, according to the invention, a phase locked loop comprises means for providing an output signal, means for providing a reference signal, means for dividing the output signal by a predetermined divisor, phase detector means, and means for adjusting the gain of the phase detector means. The means for dividing the output signal provides a divided signal to the phase detector means for comparing the phase of the divided signal with the phase of the reference signal. The means for comparing the phase of the divided signal with the phase of the reference signal has an adjustable gain and is coupled to the means for providing a output signal.

BRIEF DESCRIPTION OF THE DRAWING

The FIGURE shows a circuit diagram of a phase locked loop in accordance with the present invention.

DETAILED DESCRIPTION OF THE PREFERRED EMBODIMENT

Referring to the FIGURE, a PLL 100 in accordance with the invention is shown. The PLL 100 operates to provide a frequency-variable output signal 150 from a voltage-controlled oscillator 148 that is controlled by a control signal 146. To generate the control signal 146, a divided signal 158 is compared, in a phase comparator 106, with a reference signal 105 provided by a frequency source, or oscillator 102 (that produces a source-frequency signal 103) in conjunction with a divide-by-R divider 104 (that divides the source-frequency signal 103 to the desired frequency). The divided signal 158 is produced by a divide-by-N divider that is disposed between the output of the VCO 148 and the phase comparator 106. The value of the divisor "N" is determined by a microprocessor 162. Thus, various reference signals 105 (differing in frequency) may be provided. The information representing the choice of the divisor N is first applied by the microprocessor 162 to a shift register 156, through a microprocessor line 164, and then it is applied to the divider 152, through a bus line 154. The microprocessor 162 also provides information representing choice of the divisor "R" to the divider 104 through a microprocessor line 164, and then it is applied to the divider 104, through a bus line 160.

The divider 152 divides the output signal 150 by N and applies the divided signal 158 to the phase detector 106. The phase detector 106 compares the phase of the divided signal 158 with the reference signal 105. The phase detector 106 provides a phase comparison signal 121, representing the detected phase difference, to a low-pass loop filter 130. The phase comparison signal 121 is filtered by a low-pass loop filter 130 to filter noise and spurious energy to prevent unwanted modulation of the VCO 148. The low-pass loop filter 130 provides a filtered control signal 146 to the VCO to set the frequency of the output signal 150.

The phase detector 106 includes a conventional logic control circuit 108, such as the one discussed in U.S. Pat. No. 4,714,899, to Kurtzman et al. (hereby incorporated by reference). When the logic control circuit 108 detects the leading edge of a pulse of the reference signal 105, the logic control circuit 108 provides a signal 109 that turns on the switch 110, thus enabling a biased transistor 114. Thus, the charging of the capacitor 116 is initiated by closing the switch 110. A resistor 112 is disposed between the switch 110 and the transistor 114 to form a source of contact current (I) for charging the ramp capacitor 116. As the ramp capacitor charges, it provides a well-known voltage versus time "ramp" characteristic having a slew rate (i.e., slope) equal to the difference between the sampled voltages divided by the different in the sampled times. When the logic control circuit 108 detects the leading edge of a pulse of the divided signal 158, the logic control circuit 108 provides a signal (not shown) that turns on the switch 110, thus enabling a biased transistor 114. Thus a sawtooth wave (the voltage across the capacitors 116 and 122 versus time) is formed, having the period of the reference signal 105.

Increasing the slew rate of the phase detector 106 decreases the lock time of that circuit. A greater slew rate also compromises noise performance. However, the noise performance is less critical during receive-to-receive or receive-to-talk transition times. Therefore, during such times, the microprocessor 162 provides a switching signal 123 to a transistor 128 (through the shift register 156 and a resistor 124) that drives the transitor 128 into saturation, thus coupling a second ramp capacitor 122 to ground in parallel with the first ramp capacitor 116. The resulting increase in capacitance increases the slew rate of the phase detector and consequently, decreases the lock time of the PLL 100. The slew rate can be selectively adjusted to optimize the phase detector gain with respect to different reference signals 105 (e.g., first and second reference signals).

The logic control circuit 108 samples the sawtooth voltage by closing a sampling switch 118 for a window of time and letting a hold capacitor 126 charge to the sampled voltage. The charge established on the hold capacitor 126 remains approximately constant until the next sampling. Thus, an error voltage 121 is provided by the phase detector 106 to the loop filter 130.

The low-pass filter 130 is a conventional adaptive loop filter. The amplifier 132 amplifies the error voltage 121. One terminal of a resistor 136 is coupled to the output of the amplifier 132 at a node 135 and the other terminal is coupled to the VCO 148 at a node 137. A terminal of a resistor 138 and a terminal of a capacitor 142 are coupled to the node 137. The opposite terminals of the resistor 138 and the capacitor 142 are coupled together at a common node 141. A capacitor 144 is disposed between the node 141 and ground to complete a low-pass filter. A switch 134 is disposed between the nodes 135 and 137, so that a signal (not shown), produced by the microprocessor 162, closes the switch 134, bypassing the filter.

An alternative current source 170 may be used for adjusting the slew rate (and gain) of the phase detector 106 in lieu of using the transistor 128 and capacitor 122. It will be appreciated by those skilled in the art that, the slew rate of a sample and hold phase detector may be increased by increasing the current for charging the ramp capacitor. The circuit 170 uses a PNP transistor 174 as a switch to provide the current I through a resistor 172 in response to the switching signal 123 provided by the shift register 156. A pair of resistor 176 and 178 are provided at the base of the transistor 174 for biasing purposes.

What is claimed is:

1. A phase locked loop comprising:
   controlled oscillator means for providing an output signal, having a variable frequency responsive to a control signal;
   reference means for providing first and second reference signals;
   divider means for dividing the output signal by a predetermined divisor, to provide a divided signal;
   sample and hold phase detector means, having adjustable gain and slew rate, for comparing the phase of alternatively, the first and second reference signals with the phase of the divided signal; and:
   means for selectively adjusting the slew rate of the sample and hold phase detector means to optimize the adjustable gain of the phase detector means with respect to, alternatively, the first and second reference signals.

2. The phase locked loop of claim 1, wherein the phase detector means has an adjustable slew rate, and the means for adjusting the gain of the phase detector means comprises a current source for applying a current signal to an adjustable capacitance means for determining the slew rate.

3. The phase locked loop of claim 1, wherein the phase detector means has an adjustable slew rate, and the means for adjusting the gain of the phase detector means comprises a variable current source coupled to the adjustable capacitance means for providing a variable current signal to the adjustable capacitance means, and for determining the the slew rate, 4. The phase locked loop of claim 1, further comprising an adaptive low-pass filter, disposed between the phase detector means and the controlled oscillator means.

5. The phase locked loop of claim 1, wherein the controlled oscillator means comprises a voltage-controlled oscillator.

6. The phase locked loop of claim 5, wherein the divider comprises a divider.

* * * * *